United States Patent [19]

Nguyen et al.

[11] Patent Number: 5,600,284
[45] Date of Patent: *Feb. 4, 1997

[54] HIGH PERFORMANCE VOLTAGE CONTROLLED OSCILLATOR

[75] Inventors: Trung T. Nguyen, San Jose; Jin Zhao, Milpitas, both of Calif.

[73] Assignee: LSI Logic Corporation, Milpitas, Calif.

[*] Notice: The term of this patent shall not extend beyond the expiration date of Pat. No. 5,469,120.

[21] Appl. No.: 543,740

[22] Filed: Oct. 16, 1995

Related U.S. Application Data

[63] Continuation of Ser. No. 351,636, Dec. 7, 1994, Pat. No. 5,469,120.

[51] Int. Cl.$^6$ ............................. H03B 5/04; H03B 5/24
[52] U.S. Cl. .................. 331/177 R; 331/8; 331/17; 331/34; 331/175; 327/237; 327/270
[58] Field of Search ........................... 331/8, 17, 34, 331/57, 108 R, 109, 116 FE, 175, 176, 177 R; 327/237, 256, 257, 270; 326/21, 34

[56] References Cited

U.S. PATENT DOCUMENTS

| | | | |
|---|---|---|---|
| 3,612,901 | 10/1971 | Lee | 307/106 |
| 3,824,413 | 7/1974 | Awipi et al. | 307/295 |
| 3,904,988 | 9/1975 | Hsiao | 331/111 |
| 4,178,567 | 12/1979 | Johnson | 331/177 |
| 4,694,261 | 9/1987 | Ewen et al. | 331/57 |
| 4,956,618 | 9/1990 | Ulmer | 331/116 |
| 5,070,311 | 12/1991 | Nicolai | 331/111 |
| 5,072,197 | 12/1991 | Anderson | 331/57 |
| 5,081,429 | 1/1992 | Atriss et al. | 331/57 |
| 5,239,274 | 8/1993 | Chi | 331/57 |
| 5,262,735 | 11/1993 | Hashimoto et al. | 331/45 |
| 5,298,870 | 3/1994 | Cytera et al. | 331/45 |
| 5,363,066 | 11/1994 | Chen et al. | 331/17 |
| 5,469,120 | 11/1995 | Nguyen et al. | 331/57 X |

*Primary Examiner*—David Mis
*Attorney, Agent, or Firm*—Hickman Beyer & Weaver

[57] ABSTRACT

A bias voltage generator for a voltage controlled oscillator is described. In one aspect of the invention, the bias voltage generator includes a biasing circuit to generate a minimum clock output at zero operating voltage, and includes a common mode rejection circuit for the BIASN and BIASP control voltages for the differential delay stages and a IDD test current shut-down circuit. A differential delay stage is described that includes a current source controlled by the BIASN and BIASP control voltages from the bias voltage generator, a resistance linearization circuit for current controlling transistors of a BIASN circuit, and a process variation circuit for compensating for temperature and process variations. The improved characteristics of the resulting VCO permits high frequency operation with a relatively low gain, relatively constant gain throughout operating voltage range, improved noise rejection capabilities, increased speed of delay stage, and reduced output signal swing. All of which contribute to improved phase locked loop reliability especially when operating near the ends of the operating range.

15 Claims, 8 Drawing Sheets

HIGH PERFORMANCE VOLTAGE CONTROLLED OSCILLATOR

This is a continuation of application Ser. No. 08/351,636 filed on Dec. 7, 1994 now U.S. Pat. No 5,469,120.

BACKGROUND OF THE INVENTION.

This invention relates generally to voltage controlled oscillators. More particularly, it relates to improved bias voltage generators and differential delay stages for high frequency voltage controlled oscillators.

Voltage controlled oscillators are commonly used in phase locked loops (PLLs) which are utilized in various applications where maintaining sequential operations by a clocked pulse is desired. By way of example, computers, tuning receivers, and data communications systems often use PLLs for sequential management of internal operations or for extracting clock information from received signals. PLLs are often implemented in CMOS technology because of their relatively low standby power consumption, relative high manufacturing density, high input impedance, and ability to operate from a wide range of voltages.

Referring initially to FIG. 1, a block diagram of a typical phase lock loop with its various stages and feedback processes will be described. A reference clock signal 2 having a specified frequency and phase is input into a phase detector 4. The phase detector 4 detects the phase difference between the reference clock signal 2 and a feedback signal 12 and sends a corresponding error signal to a charge pump 6. The error signal causes the charge pump to pump or withdraw charge accordingly and to output a signal to loop filter 8. The output of the loop filter, in turn, is used to control a voltage controlled oscillator (VCO) 10 to adjust the phase and frequency of the output signal. The output from the VCO is then fed back (feedback signal 12) to the phase detector 4 where its phase is compared to that of the reference clock signal 2 in a recursive fashion. In a phase lock condition, the phase of the signal output from the oscillator is fixed relative to the reference signal and has a frequency that is a multiple of the reference signal's frequency.

One of the problems inherent with phase locked loops is that it is difficult to maintain a constant frequency under varying conditions such as ambient temperature and variations in power supply voltage. This is because the frequency is a function of the open loop gain of the PLL 1 which is affected by such varying conditions. There are also variations in frequency response of the VCO to a given input voltage from chip-to-chip due to process variations from manufacturing. Process variations are variations in chip characteristics, such as transistor gain, that differ from manufacturing lot to lot or from variations that result from different supplier manufacturing processes of different suppliers.

Referring to FIG. 2, a prior art VCO invertor stage circuit 10 is shown that includes a process variation circuit 12 for adjusting oscillation frequency to compensate for the above-described process variations. The process variation circuit 12 includes a P-channel transistor 14 and an N-channel transistor 16 connected in parallel with their sources tied together and their drains tied together, respectively. The sources of transistors 14 and 16 are coupled to the output of the VCO (which is often referred to as the "invertor" in the art). The gate of transistor 14 is connected to an LP2 input 18 and the drains of transistors 14 and 16 are connected to the gate of an N-channel transistor 20. The source and drain of transistor 20 are grounded such that the transistor serves as a capacitor. The effect of the process variation circuit 12 is to slow down oscillations that are above nominal, as will be discussed in greater detail subsequently. Unfortunately, the process variation circuit 12 is not as effective in speeding up oscillations that are below nominal.

It is particularly difficult to design PLLs for high frequency applications (above 50 Megahertz) since the open loop gain of the PLL can vary significantly due to these varying conditions and process variations. Typically, process variations that result in high gain, i.e. faster transistors than nominal, are referred to in the industry as a "best case process." Similarly, process variations that result in slower transistors are referred to as a "worst case process."

FIG. 3 illustrates typical gain curves for the nominal case process 22 (desired operation), the best case process 23 (faster transistors), and the worst case process (slower transistors) for a typical prior art invertor (VCO). The curves show that the input voltage LP2 at input 18 must vary over a wide range (about 2 V) when operating at a frequency of about 50 MHz due, primarily, to process variations. At 50 MHz, for example, a nominal gain curve 22 typically has an input voltage of around 2 V. An input voltage LP2 at input 18 for the gain curve of a best case process 23 is reduced to around 1 V whereas the input voltage LP2 at input 18 for the worst case process 24 is about 3 V. It is often difficult to design a circuit to provide an input voltage of that can cover that wide a range, and as can be seen in FIG. 3, the range gets wider with higher operating frequencies.

With advancing technology, devices are designed for higher frequencies therefore requiring corresponding increases in gain, as can be seen in any of the operating curves of FIG. 3. Since noise is related to the gain, the increase in gain also dramatically increases the noise in the system thereby increasing the VCOs susceptibility to noise. This noise comes mainly from the power supply VDD and ground VSS where it is introduced from the operation of logic circuits. The high gain causes increased susceptibility to noise that may lead to output signal jitter making it unacceptable for many applications.

The process variation circuit 12 in FIG. 2 compensates to adjust the oscillation frequency of the invertor (VCO). During a scenario where the delay stage frequency is high, a high input level at LP2 18 causes the resistance seen at the sources of the P-channel transistor 14 and N-channel transistor 16 to be small and the capacitance of transistor 20 seen at the gate to be large thus causing a slowdown in the delay stage. In a scenario where the delay frequency is slow due to a low input level at LP2, the resistance at the sources of transistors 14 and 16 is high causing an isolation of the capacitor 20 and thereby reducing its effect on the delay stage.

One of the disadvantages of circuit 12 is that it mainly only affects the best case process where the capacitor 20 slows down the invertor, whereas the capacitor becomes isolated in the worst case process thus having a negligible affect. Furthermore, previous problems with VDD noise are still present, for example, when VDD drops the gain increases dramatically. For a typical 100 Megahertz per Volt (MHz/V) gain a 1 mV increase in control voltage may result in a 0.1 MHz increase in noise. Also, since the VCO operates only after a sufficient turn on voltage for the transistors is achieved, when the reference clock stops the VCO control voltage drops to zero (falls off) thus stopping oscillation.

Another technique used in the past in to reduce VDD noise was to add a filtering circuit consisting of resistance and capacitance to the power supply to filter out the noise. A disadvantage with this approach is that the resulting voltage drop across the filter reduces the voltage supplied to the phase locked loop. As circuit frequencies increase, the voltage requirements of the phase locked loop may increase to the point where sufficient voltage is not available for operation. The filtering circuit also only filters noise associated with the P-channel transistors of the current source in the oscillator and does not provide increased protection from noise for the N-channel transistors. Accordingly, it is desirable to obtain a high frequency VCO with relatively low gain with improved noise rejection characteristics utilizing a common mode rejection circuit.

SUMMARY OF THE INVENTION

In accordance with purpose of the present invention, an improved VCO including an improved bias voltage generator and an improved differential delay stage is disclosed. In one embodiment of the invention, the bias voltage generator includes a biasing circuit for maintaining a voltage floor such that an initial oscillator frequency is present at zero input voltage. This permits the gain to increase moderately to reach the desired operating frequency. The frequency of the oscillator of the VCO is typically controlled by set of voltage control inputs, BIASP and BIASN generated from the bias voltage generator. Included in the bias voltage generator of the present invention are BIASP and BIASN voltage control circuits for controlling the P-channel transistors and N-channel transistors in the differential delay stages. Additionally, a common mode rejection circuit is incorporated into the bias mode generator to commonly reject power supply noise from both the BIASP and BIASN circuits.

A biasing voltage is maintained through the use of a P-channel metal oxide semiconductor transistor (PMOS) source-follower circuit having a transistor turn-on voltage constituting a voltage floor such that a minimum oscillator frequency of 20 Megahertz (MHz) is generated. The bias voltage generator further includes a stabilizing capacitor to stabilize the output of the source follower and an IDD shut-down circuit to shut-down the current in the differential delay stage prior to performing IDD tests that are in widespread use for CMOS circuits.

In another embodiment, an improved differential delay stage is provided. The differential delay stage includes a voltage controlled current source coupled to a power supply at one end and coupled to the BIASP and BIASN control outputs of the bias generator. The control outputs control the amount of current injected in the delay stage to adjust the phase and frequency of a differential signal. Also included are switching transistors coupled to the differential inputs for receiving input signals having a specific frequency. A BIASN circuit including a pair of N-channel transistors for receiving the BIASN output from the bias generator, and a resistance linearization circuit comprising a pair of series-connected N-channel transistors to sustain a non-variable current through the BIASN circuit is included. Finally, the differential delay stage includes a process variable circuit used to compensate for temperature and process variations during operation and to help maintain constant phase and frequency of the output signal. The differential delay stage and the bias voltage generators may be used separately or in combination.

An improved high performance high frequency voltage controlled oscillator that includes a bias voltage generator of the present invention coupled to a circuit of series connected differential delay stages is also described. Each differential delay stage is connected in parallel to the BIASP and BIASN outputs of the bias generator. The output signal of the last stage has a reduced signal swing and is connected to an amplifier stage for amplifying the output signal to a rail-to-rail signal (0–3.3 V) for use with logic circuits. The resulting VCO has faster speed compared to prior art invertors, has relatively low gain and possesses higher noise rejection capabilities than previous circuits.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

Figure 1:
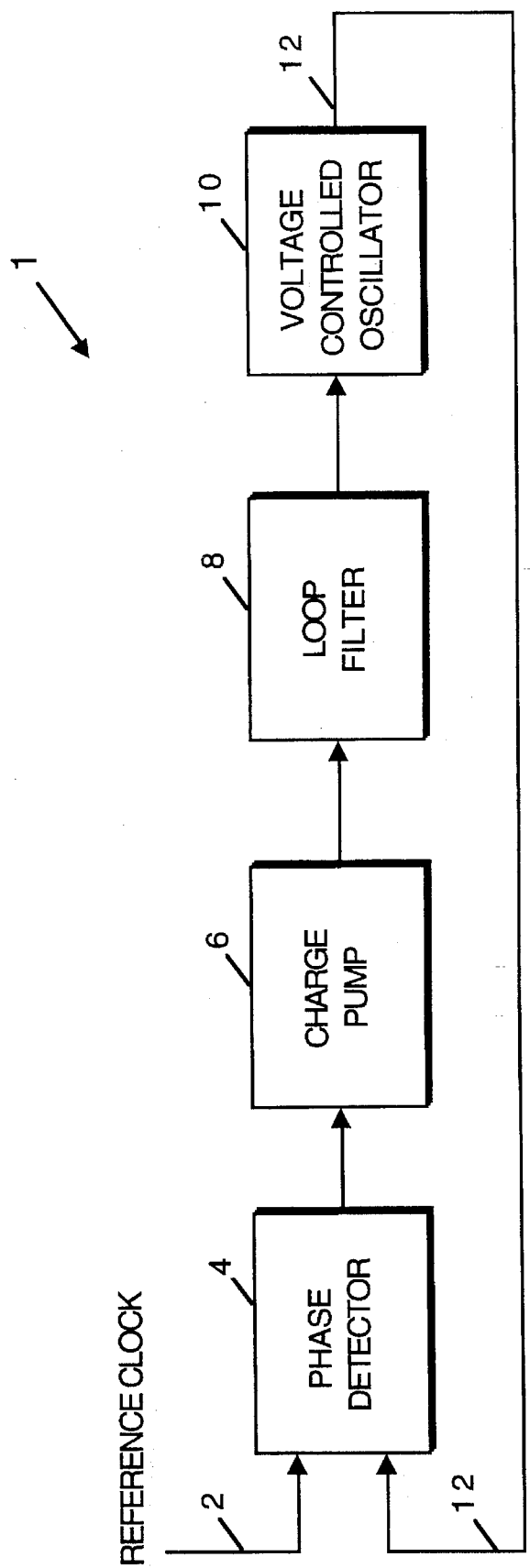
FIG. 1 is a block diagram of a prior art phase locked loop (PLL)
Figure 2:
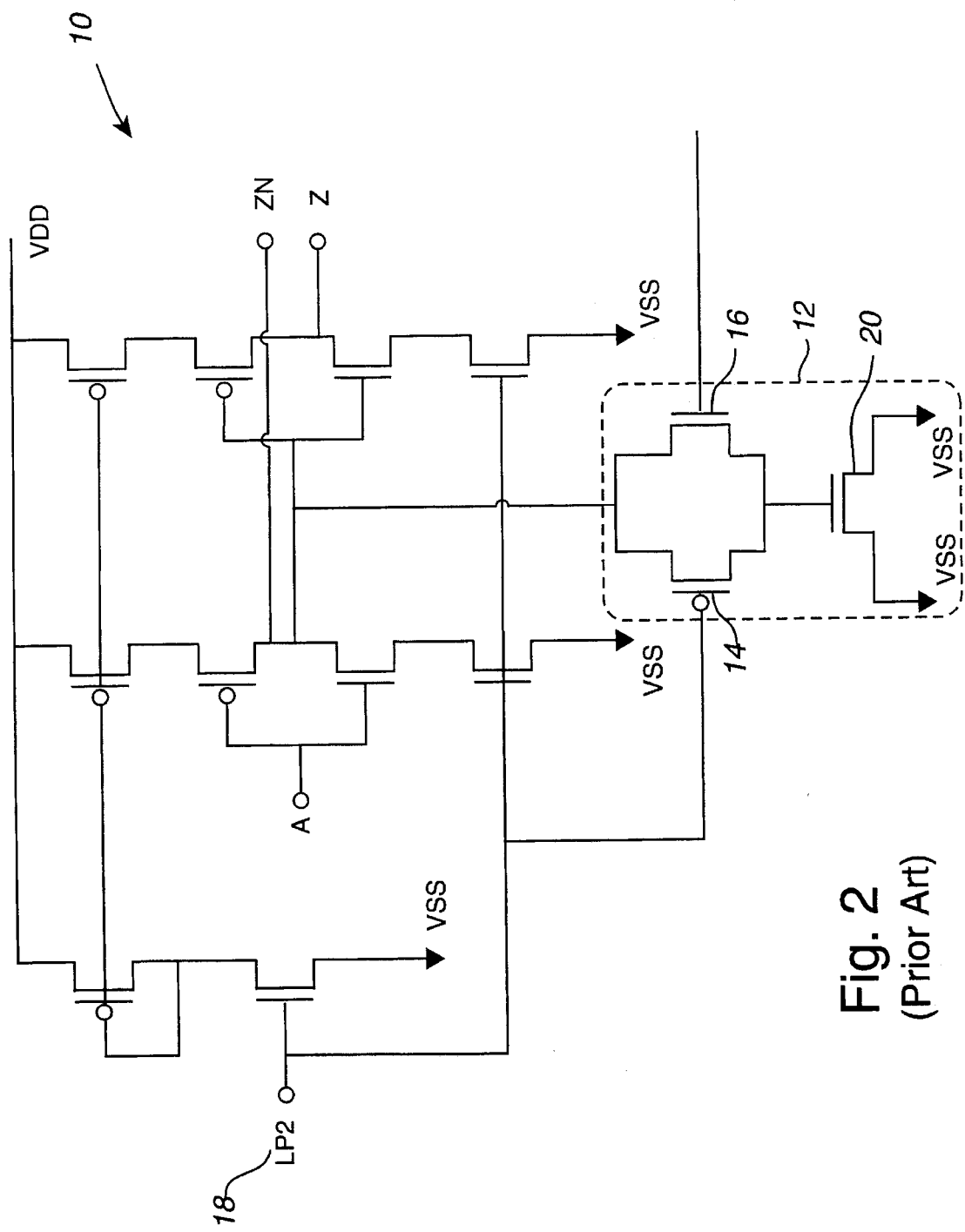
FIG. 2 is schematic of a prior art voltage controlled oscillator (VCO)
Figure 3:
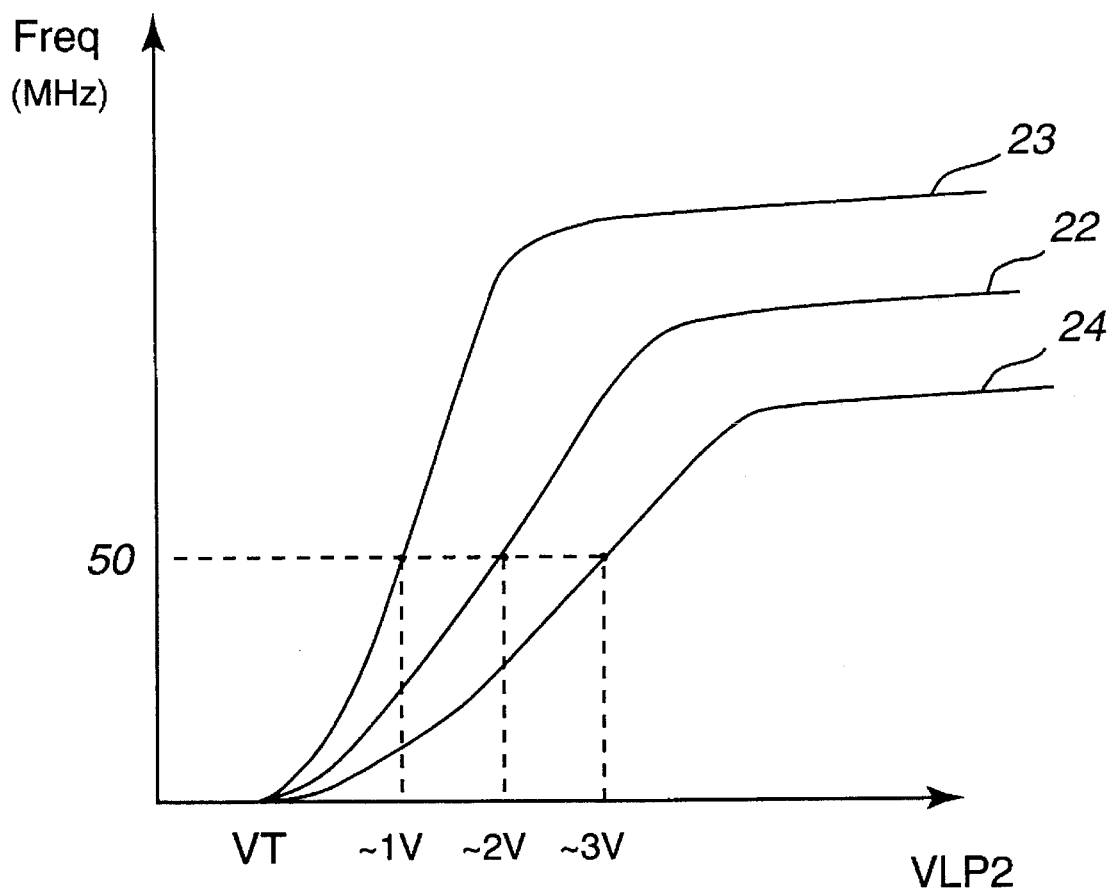
FIG. 3 are three different gain curves due to process variations of a prior art VCO.
Figure 4:
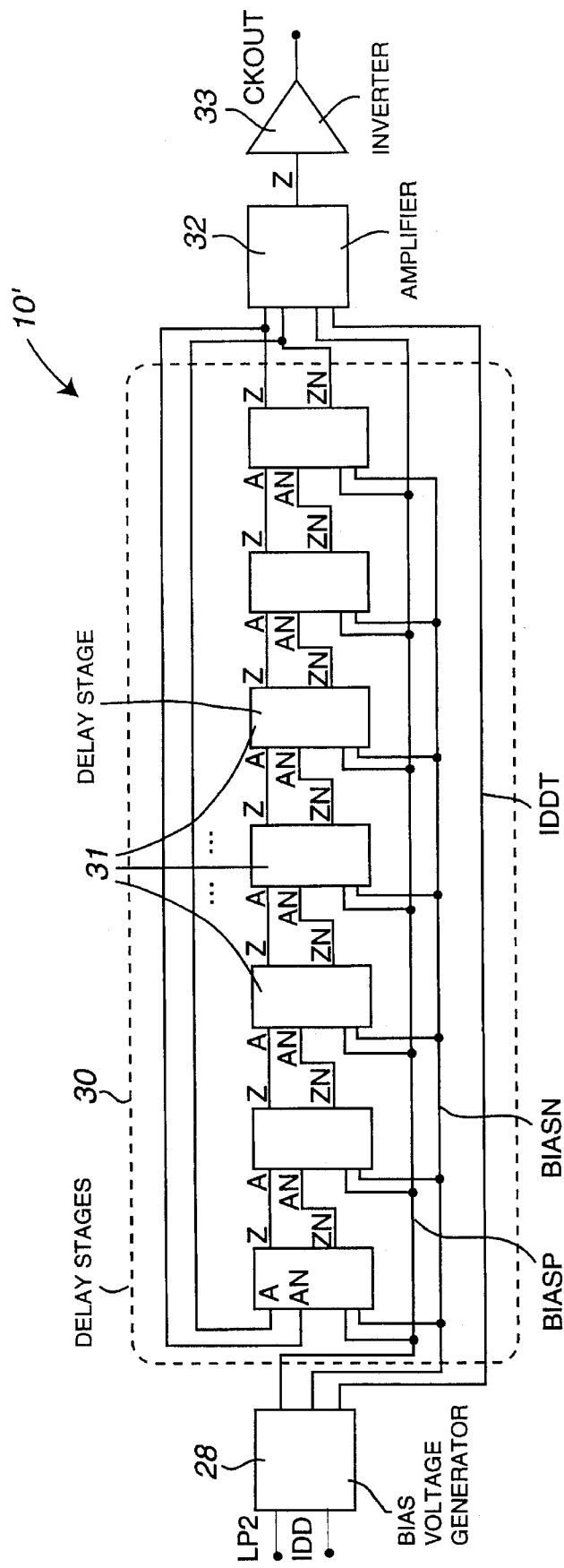
FIG. 4 is a schematic illustrating an improved VCO in accordance with the present invention.

FIGS. 1–3 pertain to prior art VCOs and are discussed above. FIG. 4 shows a schematic of an improved VCO 10' of the present invention that includes a bias voltage generator 28 and a series of delay stages 30 having an input coupled to an output of the generator 28. The improved VCO 10' also includes an amplifier 32 having an input coupled to an output of the delay stages 30, and an optional invertor 33 having an input coupled to the output of the amplifier 32.

The bias generator 28 has an LP2 input from a loop filter 8 (see FIG. 1) and an IDD current shut down input. The VCO 10' operates in place of the VCO 10 in FIG. 1. The outputs of the bias voltage generator 28 include BIASP (bias for the P-channel transistors) and BIASN (bias for the N-channel transistors) voltage control outputs connected in parallel to each individual delay stage 31 for controlling frequency and phase. The BIASP output of the bias voltage generator 28 is further connected to the input of amplifier 32. The output of the bias voltage generator 28 also has an IDDT output that connects to the input of amplifier 32. The outputs of the bias voltage generator 28 are further connected to delay stages 30 comprising a series connection of differential delay stages 31.

Each delay stage 31 is preferably inverting and has an input A and AN and outputs Z and ZN which are connected such that the outputs Z and ZN of a previous stage are connected to the inputs A and AN of a following stage, thereby connecting the stages 31 in series. The delay stages 31 therefore form an ordered series or sequence of stages, wherein the input of each stage (with the exception of the first stage) is dependent upon the output of a preceding stage. The outputs Z and ZN of the last stage of the VCO are connected to the inputs A and AN of the first stage to provide VCO feedback for error correction. Typically, an odd number of inverting delay stages 31 are connected in series to achieve a phase shift of 180° but it is possible to employ an even number of stages by switching the outputs of the final stage to make it non-inverting from the input. The outputs Z and ZN of the final stage are sent to the amplifier stage 32 where the output voltage range is amplified and then sent to invertor 33 for use with logic circuits.

Figure 5:
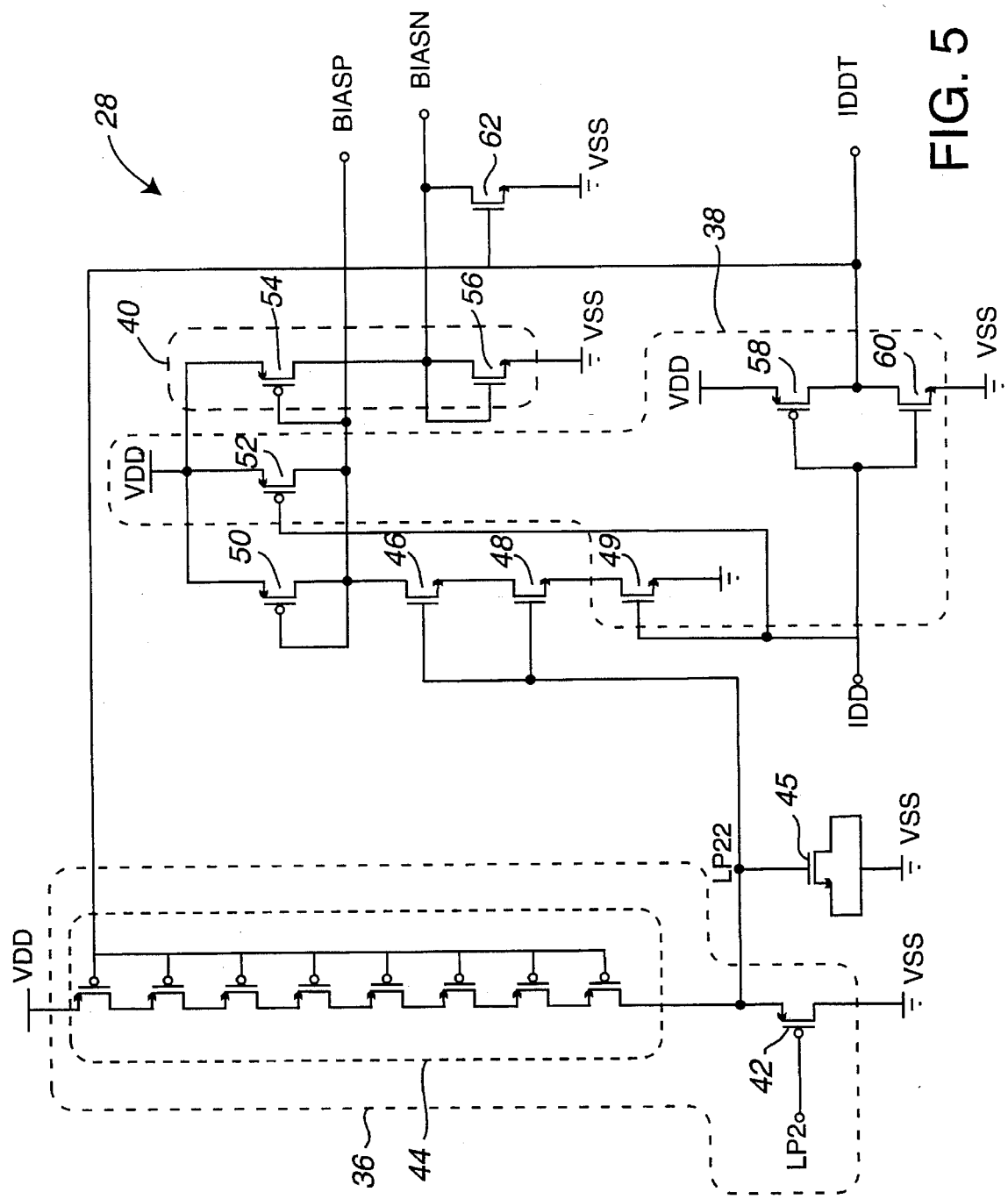
FIG. 5 is a schematic of one embodiment of a bias voltage generator in accordance with the present invention.

Referring next to FIG. 5, an improved bias voltage generator 28 in accordance with a first embodiment of the present invention and shown as element 28 in FIG. 4 will be described. The bias voltage generator includes a source-follower circuit 36, an IDD shut down circuit 38 (transistors 49, 52, 60, and 62) and a common mode rejection circuit 40 arranged to commonly reject noise from power supply VDD affecting the BIASN and BIASP voltage control signals.

The bias voltage generator receives an error correction input signal LP2 from a loop filter (such as loop filter 8 of FIG. 1) to generate an associated bias voltage to control the frequency of the differential delay stage. Input signal LP2, in FIG. 5, is fed into a P-channel transistor 42 of a source-follower circuit 36. The source of transistor 42 is coupled to a series connection of P-channel transistors 44 (connected source to drain) with their gates tied together and connected to a power supply VDD. The series connected unit 44 forms a biasing resistance for the source-follower 36. The output LP22 of the source-follower is taken at the source of transistor 42 and is stabilized by an N-channel transistor 45 connected as a capacitor. The voltage output at LP22 is LP2 plus the turnon voltage of transistor 42 (approximately 0.7 V) such that source-follower 40 provides a voltage floor large enough to generate a clock frequency of about 20 MHz at zero input voltage at LP2. Since the VCO starts working at zero voltage instead of at the turnon voltage, as in prior art VCOs, the range for the control voltage LP2 is increased thereby reducing the gain (since VCO gain=$\Delta f/\Delta V$). This allows a lower gain at higher operating frequencies thereby reducing amplification of system noise.

Since temperature affects the turnon voltages for MOS devices, there is a process variation compensation benefit provided by the source-follower circuit 40. By way of example, in a scenario where the differential speed is slowed due to an increase in temperature, the higher temperature causes the turnon voltage of transistor 42 to increase (to about 1 V) thereby increasing the voltage at LP22. This causes more current to be pumped into the differential stage thus bringing up the differential speed which compensates. The scenario where the differential speed is too fast, due to lower temperatures, therefore results in a lower turnon voltage (about 0.5 V) for transistor 42 thereby lowering the voltage at LP22 thus slowing down the differential speed. Thus source-follower circuit works to stabilize and provide a fairly constant VCO gain over a wide range of operating conditions.

The output LP22 of the source-follower 36 is coupled to gates of a pair of series connected (connected source to drain) N-channel transistors 46 and 48 which are, in turn, coupled to an IDD shut down circuit 38 through transistor 49. The drain of transistor 48 is connected to the source of transistor 49 whose gate is connected a IDD shut down pin. The IDD shut down circuit 38 is used for shutting down DC current in the differential delay stage prior to performing IDD testing. The source of transistor 46 is connected to the drains of three parallel connected P-channel transistors 50, 52, and 54 with their sources coupled to power supply VDD (typically 3–5 volts). The gates of transistors 50 and 54 are connected to the drains of 50, 52, and 54 and further connected to a BIASP output terminal. This arrangement permits transistor 52 to be turned on when the IDD pin is low thus causing the drain to go high, since the BIASP output is tied to the drain of transistor 52, BIASP goes high thereby shutting off the P-channel transistors in the differential delay stage.

The second part of the IDD circuit consists of a pair of complementary transistors 58 and 60 connected in series where the source of P-channel transistor 58 is coupled to VDD, its drain connected to the source of N-channel transistor 60 with its drain grounded. The gates of transistors 58 and 60 are tied together and connected to the IDD shut down pin, and an IDDT output is taken at the drain/source of transistors 58 and 60. With the IDD pin low, transistor 58 is turned on pulling the IDDT output high thus turning on N-channel transistor 62 which pulls the BIASN output low thereby shutting off the N-channel transistors in the differential delay stage. A common mode rejection circuit 40 is also included to connect the BIASN and BIASP outputs to the power supply VDD. Noise superimposed on or fluctuations in VDD causes shifts in the BIASN and BIASP outputs to shift simultaneously. Since it is differences in inputs that causes the output to switch, these differences are minimized from the simultaneous shifting thereby yielding improved noise rejection.

Figure 6:
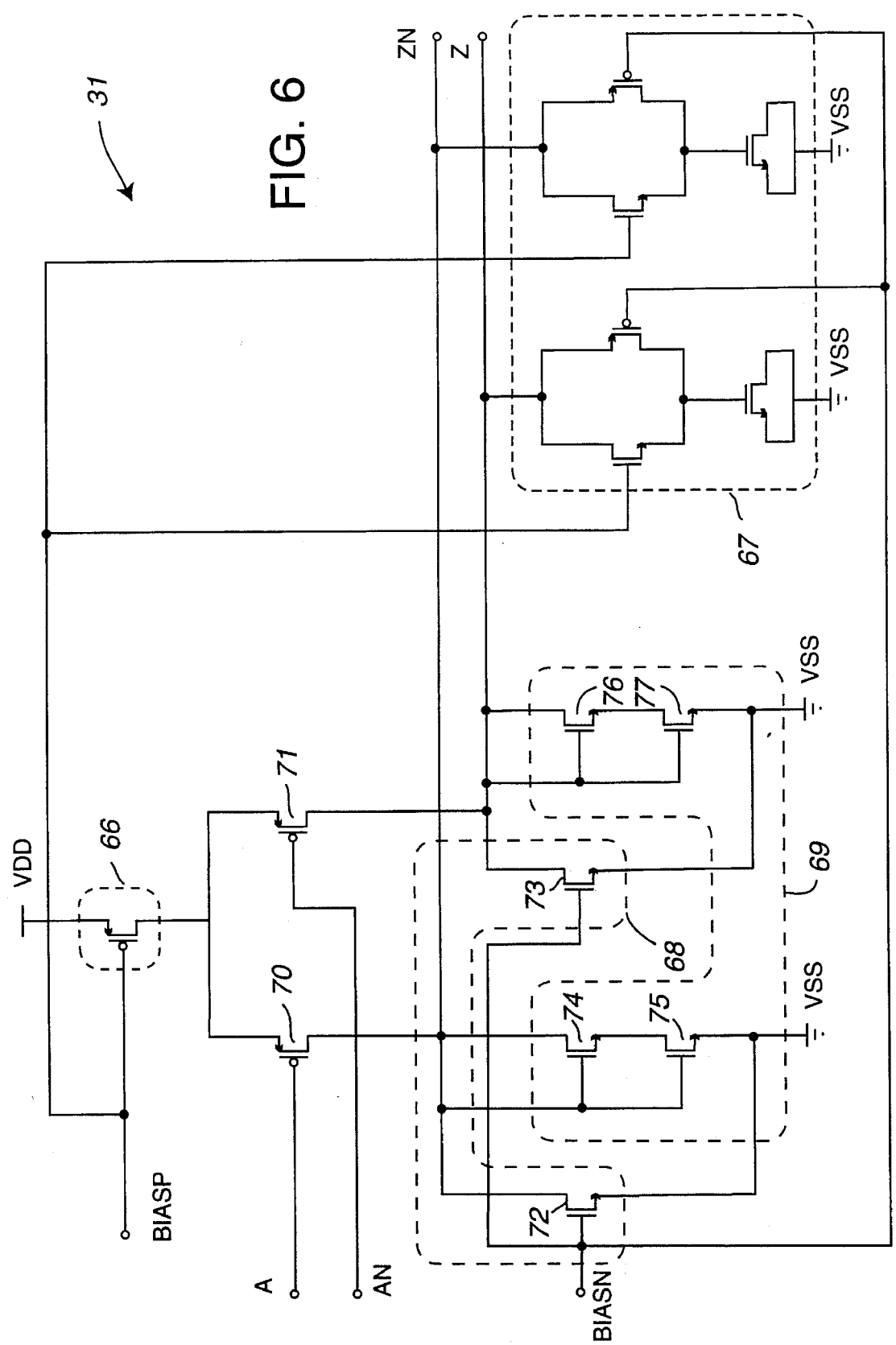
FIG. 6 is a schematic of one embodiment of a differential delay stage in accordance with the present invention.

Referring now to FIG. 6, a differential delay stage 31, as shown in FIG. 4, according to one embodiment of the present invention is described. The differential delay stage 31 includes a current source 66, BIASN and BIASP inputs for receiving BIASN and BIASP voltage control signals from a bias voltage generator, a differential input pair (A and AN) for receiving an input signal having a specific frequency and phase, and a differential output pair (Z and ZN) for transmitting an output signal. The embodiment of the present invention further includes a process variation circuit 67, to compensate for temperature and process variations, a BIASN circuit 68 and a resistance linearization circuit 69 consisting of N-channel transistors 74, 75, 76, and 77.

The current source comprises a P-channel transistor switch 66 whose source is connected to power supply VDD, the gate is connected to the BIASP input to acts as a master valve for controlling the current flow. The drain of transistor 66 is connected to the sources of the differential input P-channel transistors of 70 and 71 respectively. Differential input A is connected to the gate of 70 and differential input B is connected to the gate of 71 thereby providing current paths that can be controlled by the input signals. The drains of 70 and 71 are connected to differential outputs ZN and Z respectively and are arranged to provide signal inversion of the input signal. The drains of 70 and 71 are further connected to a BIASN circuit 68 that controls the current source through N-channel transistors in the differential delay stage via the BIASN voltage control signal.

The BIASN circuit 68 is formed from N-channel transistors 72 and 73 which receives the BIASN signal at each of the gates to control the current flow through the N-channel transistors of the differential delay stage. A pair of linearizing N-channel transistors 74 and 75 are connected in series, the pair having their gates tied together and connected to the source of transistor 74, thereby connecting the pair across the source and drain of transistor 72. Another pair of transistors 76 and 77 is connected similarly across transistor 73. Normally the resistance of metal oxide semiconductor (MOS) transistors varies with the voltage across the drain and the source ($V_{DS}$). Since the sources of 72 and 73 are connected to the outputs ZN and Z that are repeatedly switching, linearizing transistor pairs 74, 75 and 76, 77 are included to maintain the linear relationship between voltage and current thereby linearizing the resistance. This is important because Z and ZN are always inverted relative to each other, therefore both transistor units of (72, 74, 75) and 73, 76, 77) need to be linear to have the same reaction to VDD noise. This will maintain the voltage swing difference from Z to ZN.

Also included in the differential delay stage is a process variation circuit 67 to compensate for speed variations induced by temperature changes and by process variations due to inconsistent device characteristics from manufacturing. The process variation circuit 67 is well known and is made up of units similar to 12 of FIG. 2, each unit is connected to a separate differential output and each is connected to both the BIASP and BIASN control signals. The use of a process variation circuit helps to maintain a fairly constant gain under a wide range of operating conditions. This is shown quite clearly in FIG. 7 where gain curves for a nominal operating frequency of 83 MHz is shown for the embodiment of the present invention. The nominal gain curve 80 is shown along with a curve for the best case process 81 and the worst case process 82. It can be seen that the gain for the best and worst case processes rises fairly constantly and are substantially parallel with the nominal operating curve 86 therefore avoiding the prior problem of dramatically increased gain in the best case process which leads to increased jitter noise.

Figure 7:
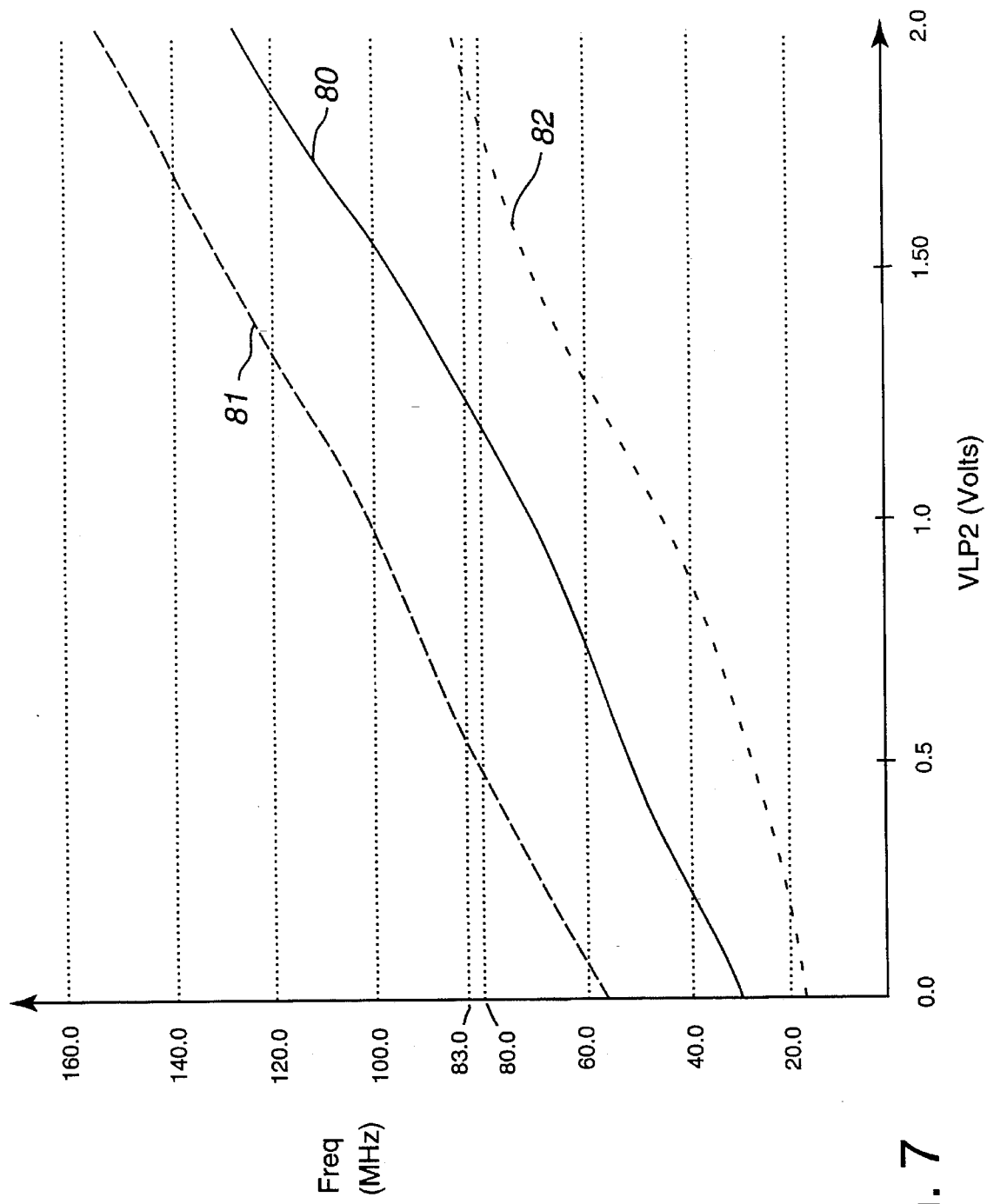
FIG. 7 is a graph of VCO frequency vs. operating voltage of a VCO that includes the bias voltage generator of FIG. 4 and a plurality of differential delay stages in accordance with FIG. 5.

FIG. 7 illustrates that at zero operating voltage, in the worst case process 84, the operating frequency is around 20 MHz and about 55 MHz for the best case process 82. The resulting circuit has significantly lower and constant gain throughout the operating range than with the previous circuits. When operating at a nominal operating frequency of 83 MHz, the operating voltage range is reduced to around 1.5 V (about 0.5 V to 2 V), such a relatively small range makes the PLL easier to design for.

In addition to the previously mentioned advantages for gain, the altered delay stage, in accordance to the present invention, has a reduced signal swing of around 1 V (0–1 V range) as opposed to the usual rail to rail 3.3 V swing.

Figure 8:
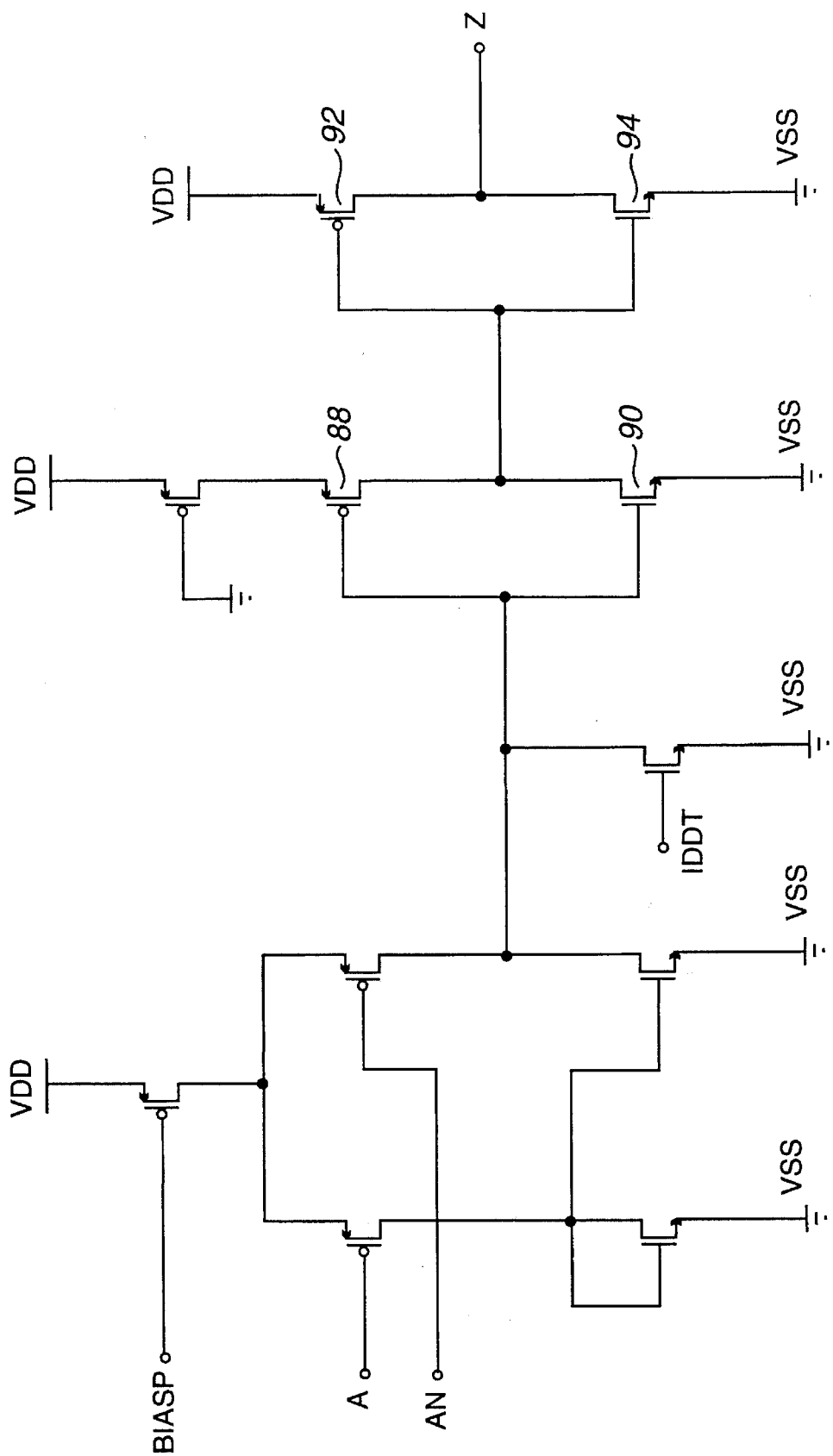
FIG. 8 is a schematic of an amplifier stage suitable for use in the present invention.

FIG. 8 illustrates a preferred circuit for amplifying the reduced signal swing to the usual 3.3 V swing needed for logic circuits. Other amplifiers are also suitable for use with the present invention. The preferred circuit has inputs that include the differential inputs A and AN for receiving the output signals Z and ZN from the last delay stage, a BIASP current controlling input from the bias voltage generator, and an IDDT from the bias voltage generator. An overall amplified clock output signal Z is taken at the drain/source of 92 and 94 and fed to an invertor 33 of FIG. 4 for driving logic circuits.

Although only one embodiment of the present invention has been described in detail, it should be understood that the present invention may be embodied in many other specific forms without departing from the spirit or scope of the invention. Particularly, there are a variety of ways in which to implement the biasing circuit (without using a source-follower), noise rejection circuits, or process variation used to improve VCO characteristics. Although, the bias generator and the differential delay stage described in the present invention are designed for use together, it should be noted that the bias voltage generator can be used with other delay stages to lower high frequency gain and improve noise rejection. Further, the described differential delay stage also possesses improved characteristics in speed, noise rejection, and small signal swing over previous differential delay stages and may be used in conjunction with other bias voltage generators. Therefore the present examples are to be considered as illustrative and not restrictive, and the invention is not to be limited to the details given herein, but may be modified within the scope of the appended claims.

What is claimed is:

1. A voltage controlled oscillator, comprising:
   (a) bias voltage generating means having an input and a pair of outputs comprising a first voltage control signal and a second voltage control signal which vary in response to variances in a voltage level at said input, wherein said bias voltage generating means maintains a voltage floor at said outputs when said voltage level at said input indicates a lack of error correction;
   (b) delay means including a series connection of a plurality of delay stages wherein each of said delay stages includes a process variation compensation circuit, said delay means having an input coupled to said first voltage control signal and an input coupled to said second voltage control signal and an output; and
   (c) amplifier means having an input coupled to said output of said delay means.

2. A voltage controlled oscillator according to claim 1 wherein an odd number of delay stages and wherein said delay means performs an inversion.

3. A voltage controlled oscillator according to claim 1 wherein an output of said voltage controlled oscillator is derived from said amplifier means.

4. A bias voltage generator comprising:
   (a) a biasing circuit having an input and an output, where said biasing circuit maintains a voltage floor at said output such that an initial output of a voltage controlled circuit is generated when a signal at said input to said biasing circuit indicates zero error correction;
   (b) a common-mode noise rejection circuit having an input and an output, said input being connected to a power supply and to said output of said biasing circuit, whereby said common-mode noise rejection circuit being used for rejecting noise from said power supply; and
   (c) a first output terminal and a second output terminal connected to said output of said common-mode noise rejection circuit, said output terminals developing a first voltage control signal and a second voltage.

5. A bias voltage generator according to claim 4 wherein the biasing circuit includes a source-follower comprising at least one MOSFET of a first polarity type.

6. A bias voltage generator according to claim 5 wherein said source-follower is stabilized by at least one MOSFET of a second polarity type.

7. A bias voltage generator according to claim 4 wherein said voltage controlled circuit is an oscillator, and wherein the voltage floor generates a minimum oscillator frequency of 20 Megahertz.

8. A voltage-controlled oscillator for adjusting the phase and frequency of a VCO input signal and capable of utilizing a plurality of delay stages, said voltage-controlled oscillator comprising:
   (a) a bias voltage generator which receives as an input said VCO input signal and outputs a first bias voltage and a second bias voltage, said first and second bias voltages varying in response to said VCO input signal, said bias voltage generator including a source follower circuit for maintaining a voltage floor, said source follower circuit having as an input said VCO input signal and having a source follower voltage output coupled to at least one of said first and second bias voltages and operative to maintain a voltage floor at one of said first and second bias voltages, said voltage floor large enough such that a clock frequency is generated when said VCO input signal is at a level of zero voltage;

(b) a delay circuit including a first delay stage, said delay circuit having a plurality of first inputs and also receiving as inputs said first bias voltage and said second bias voltage, said delay circuit having a plurality of delay outputs which are fed back to said first inputs, whereby said delay outputs and said first bias voltage are operative to produce a VCO output signal that is a phase and frequency adjusted version of said VCO input signal; and (c) a power supply for supplying power to said voltage-controlled oscillator.

9. A voltage-controlled oscillator as recited in claim 8 wherein said bias voltage generator has a current shut down input and a current shut down output, said bias voltage generator further comprising a current shut down circuit that receives said current shut down input, such that in response to a shut down signal received at said current shut down input said current shut down circuit is operative to shut down a DC current in one of said plurality of delay stages and to produce said current shut down output, whereby said current shut down output is operative to adjust said VCO output signal.

10. A voltage-controlled oscillator as recited in claim 8 wherein said bias voltage generator further comprises a common mode noise rejection circuit that is coupled to said power supply and to said first and second bias voltages such that noise from said power supply is rejected by said first and second bias voltages.

11. A voltage-controlled oscillator as recited in claim 8 wherein said delay circuit further includes a series connection of delay stages including said first delay stage and a last delay stage, each delay stage having inputs and outputs, where inputs of all but said first delay stage are coupled to outputs of a preceding delay stage, said first and second bias voltages being coupled to inputs of each delay stage, and where said inputs of said first delay stage are coupled to said first inputs of said delay circuit, and said outputs of said last delay stage are coupled to said delay outputs of said delay circuit.

12. A voltage-controlled oscillator as recited in claim 8 further comprising an amplifier circuit receiving as inputs said delay outputs and said first bias voltage and having as an output said VCO output signal.

13. A voltage-controlled oscillator for adjusting the phase and frequency of a VCO input signal and capable of utilizing a plurality of differential delay stages, said voltage-controlled oscillator comprising:

(a) a bias voltage generator which receives as an input said VCO input signal and outputs a first bias voltage and a second bias voltage, said first and second bias voltages varying in response to said VCO input signal; and (b) a differential delay circuit including a first differential delay stage, said differential delay circuit having a plurality of first inputs and also receiving as inputs said first bias voltage and said second bias voltage, said differential delay circuit having a plurality of delay outputs which are fed back to said first inputs, said delay outputs and said first bias voltage operative to produce a VCO output signal that is a phase and frequency adjusted version of said VCO input signal, wherein each one of said plurality of differential delay stages within said differential delay circuit includes:
a plurality of inputs,
a pair of differential outputs,
a second bias voltage circuit having as an input said second bias voltage of said bias voltage generator; said second bias voltage circuit including a pair of transistors connected to said pair of differential outputs, and
a resistance linearization circuit for linearizing a resistance of said pair of transistors, said resistance linearization circuit coupled to said second bias voltage circuit and operative with said second bias voltage circuit to maintain a voltage swing differential between said pair of differential outputs.

14. A voltage-controlled oscillator as recited in claim 13 further comprising a plurality of differential delay stages within said differential delay circuit, where inputs of all but said first differential delay stage are coupled to said differential outputs of a preceding delay stage, said first and second bias voltages being coupled to inputs of each differential delay stage, and where said inputs of said first delay stage are coupled to said first inputs of said delay circuit, and said outputs of said last delay stage are coupled to said delay outputs of said delay circuit.

15. A voltage-controlled oscillator as recited in claim 13 further comprising an amplifier circuit receiving as inputs said delay outputs and said first bias voltage and having as an output said VCO output signal.

* * * * *